United States Patent [19]

Virieux et al.

[11] Patent Number: 4,634,967
[45] Date of Patent: Jan. 6, 1987

[54] PHASE COMPARATOR

[75] Inventors: Philippe Virieux, Boulogne; Isabelle Azemard, Paris, both of France

[73] Assignee: Thomson-CSF, Paris, France

[21] Appl. No.: 566,733

[22] Filed: Dec. 29, 1983

[30] Foreign Application Priority Data

Dec. 30, 1982 [FR] France .............................. 82 22077

[51] Int. Cl.$^4$ .............................................. G01R 25/00
[52] U.S. Cl. ............................... 324/83 D; 324/83 FE
[58] Field of Search ................ 324/79 R, 79 D, 83 R, 324/83 D, 83 FE; 370/85, 58; 307/231, 510, 511, 514, 518; 364/484, 485

[56] References Cited

U.S. PATENT DOCUMENTS 3,828,279  8/1974  Labarber ........................ 324/83 D

FOREIGN PATENT DOCUMENTS 2733890  2/1979  Fed. Rep. of Germany ... 324/83 D
8203739  10/1982  PCT Int'l Appl. .................. 370/85
1198222  7/1970  United Kingdom ............ 324/83 D

OTHER PUBLICATIONS

Transactions of the IECE of Japan, vol. E-65, No. 3, Mar. 1982, pp. 154-158, Tokyo, Y. Ogawa et al: "Doppler Shift in a Standard Frequency via a Broadcasting Satellite".

IEEE Transactions on Nuclear Science, vol. NS-28, No. 3, partie 1, Jun. 1981, pp. 2158-2159, NY, D. W. Reid et al: "A 360 Degree Digital Phase Detector with 100-khz Bandwidth".

Primary Examiner—Michael J. Tokar
Attorney, Agent, or Firm—Oblon, Fisher, Spivak, McClelland & Maier

[57] ABSTRACT

The invention relates to a phase comparator making it possible to measure the phase displacement between several very high stability oscillators and having for this purpose a system of pairs of measuring cascades each being connected to an oscillator and supplying a first and a second signal. It also comprises a multiplexer, a counting circuit, a computer and a computer coupler making it possible to compare the first signals in pairs in order to obtain a measuring range in which is located the phase displacement between two given oscillators and making it possible to compare the two signals, in order to obtain the displacement measurements in said range.

9 Claims, 5 Drawing Figures

PHASE COMPARATOR

FIELD OF THE INVENTION

The present invention relates to phase comparators and more particularly to phase comparators used for measuring the phase displacement between several very high stability oscillators supplying a signal at the same frequency, whereby said oscillators can be cesium sources, rubidium sources, hydrogen masers or thermostatically controlled crystals.

BACKGROUND OF THE INVENTION

Very high stability oscillators are used for numerous purposes and particularly in telecommunications and satellite navigation systems. In order to be able to exploit the signals supplied by such oscillators, it is necessary to have very high performance phase comparators combining a high precision and a wide range. It is currently necessary to obtain a precision of the order of one nanosecond for a range of one millisecond. The range in which this precision is required can exceed $10^7$ times the duration of the period of the signal transmitted and the frequencies of these signals currently reach values of 1 to 60 MHz.

The conventionally used comparators are only able to satisfy one of these criteria. Thus, as the two criteria are incompatible, the comparators making it possible to obtain a high precision do not make it possible to simultaneously cover a wide range or, they make it possible to cover a wide measuring range, but with only a very moderate precision.

Moreover, the operating principle of these comparators consists of carrying out modulo $2\pi$ measurements. It is therefore necessary to add a frequency divider to meet this requirement, which increases the equipment costs. In addition, this solution leads to measurement noise, greater than the noise produced by the actual oscillators.

SUMMARY OF THE INVENTION

In order to obviate these disadvantages, the invention proposes a phase comparator able to measure phase displacements of approximately 1 nanosecond between at least two very high stability oscillators and which is able to carry out these measurements with a very good resolution in a range which can even greatly exceed the duration of the period of the signal. For oscillators emitting frequencies in a range of 1 to 60 MHz, the phase displacement is measured with a precision of a few nanoseconds in a range $10^7$ times greater than the duration of the period of the signal.

Thus, the present invention specifically relates to a phase comparator for comparing the phase of the signal at the same frequency supplied by oscillators comprising first a system of pairs of measuring cascades. Each pair has a first and a second measuring cascade connected in parallel to an oscillator and supplied by the signal transmitted by this oscillator. The first cascade has an analog-digital converter followed by a digital divider, in order to supply a first signal. The second cascade has a frequency changing circuit followed by an analog-digital converter, for supplying a second signal. The phase comparator comprises also a multiplexer receiving the signal supplied by each cascade and supplying in pairs the signals relating to the two cascades of the same type. The phase comparator comprises a counting circuit synchronized by a counting clock receiving in pairs the signal supplied by the multiplexer, one of these signals representing the count start signal and the other representing the count stop signal, in order to count the time separating the arrival of the start signal and the arrival of the stop signal and transmit a counting signal. The phase comparator comrprises a computer giving selection orders of the output signals of the multiplexer, supplying control signals for the counting circuit and receiving the counting signal; and also a circuit for coupling the computer, the counting circuit and the multiplexer.

BRIEF DESCRIPTION OF THE DRAWINGS

The invention is described in greater detail hereinafter relative to non-limitative embodiments and with reference to the attached drawings, wherein show.

DETAILED DESCRIPTION OF THE INVENTION

Figure 1:
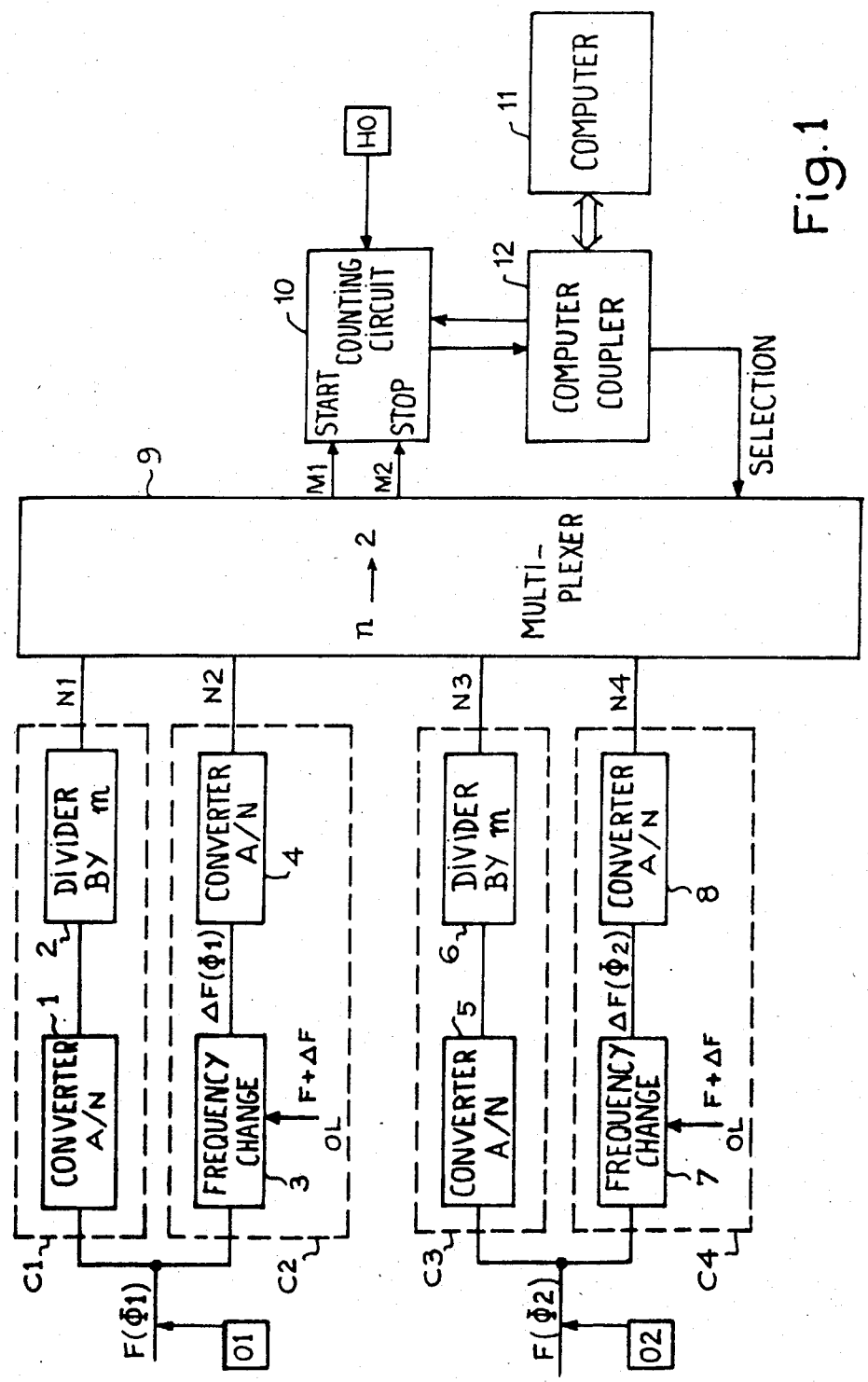
FIG. 1 a general diagram of a phase comparator according to the invention.

FIG. 1 is a general diagram of a phase comparator according to the invention. The phase displacements or shifts which it is wished to measure are phase displacements from the signals transmitted by a group of very high stability oscillators 01, 02 ... 0k. These signals are sinusoidal signals of frequency F and of respective phase $\phi1, \phi2 ... \phi k$, which are designated $F(\phi1) ... F(\phi k)$. The phase displacement between $\phi1$ and $\phi2$ or in general terms $\phi i$ and $\phi j$ can reach several hundred microseconds.

For this purpose, the phase comparator comprises a group of pairs of measuring cascades C1, C2, C3, C4 and more generally Ci, Cj. These cascades C1, C3, ... Ci are of the same type and make it possible to assume a first function consisting of giving a range in which is located the phase displacement between two given oscillators. The cascades C2, C4 ... Cj are of the same type and make it possible to ensure a second function consisting of giving a high precision to the phase displacement measurement.

Obviously each pair of cascades is supplied by an oscillator. Pair C1, C2 is supplied by oscillator 01 and respectively C3, C4 by 02 ... Ci, Cj by 0k. In order to simplify the description, a limitation will be made to k=2, but it is obvious that this number is not limited.

Oscillators 01 and 02 between which it is wished to measure the phase displacement, in each case supply two cascades. Cascade C1 receives a signal of frequency F of phase $\phi1$, designated $F(\phi1)$ transmitted by the first oscillator 01. Cascade C1 comprises an analog-digital converter 1 followed by a digital divider 2. Cascade C2 receives the same signal $F(\phi1)$ as cascade C1 and comprises a frequency changing circuit 3 followed by an analog-digital converter 4. Cascades C3 and C4 are supplied by oscillator 02 transmitting a signal of frequency F and phase $\phi2$ designated $F(\phi2)$. Phase $\phi2$ differs slightly from $\phi1$, i.e it is this displacement $\Delta(\phi)$ between $\phi1$ and $\phi2$ which it is wished to measure.

Like cascade C1, cascade C3 has an analog-digital converter 5 followed by a digital frequency divider 6. Like cascade C2, cascade C4 comprises a frequency changing circuit 7 followed by an analog-digital converter 8. The output signals of each cascade C1–C4 are respectively designated N1–N4.

A multiplexer 9 with n inputs and two outputs receives the signals N1–N4 and supplies the pairs of signals M1, M2 relating to two cascades of the same type at each selection instant. The number of inputs n of multiplexer 9 is at least equal to the number of outputs signals from cascades C1–C4 and in this special embodiment is n=4.

The two outputs of multiplexer 9 are connected to a counting circuit 10 controlled by a clock HO. Counting circuit 10 is connected to a computer 11 by means of a coupler 12. Coupler 12 is controlled by the computer and more particularly makes it possible to select the pairs of signals appearing on channels M1, M2, each selected pair relating to two cascades of the same type between which it is wished to measure the phase displacement.

The operation will now be described. The measuring process comprises three phases. A precise phase measurement is carried out by comparing basic signals of frequency F. This measurement is carried out respectively for signals $F(\phi 1)$ and $F(\phi 2)$ by cascades C2 and C4. The measurement gives the required precision and makes it possible to measure a phase displacement $\Delta \phi$ between O and $T(T=1/F)$, i.e. it is a modulo T measurement. A more approximate measurement is carried out with a wider range using digitized signals. This measurement is carried out respectively for signals $F(\phi 1)$ and $F(\phi 2)$ by cascades C1 and C3. This measurement takes place with a resolution r given by the counting clock HO of a range between O and Tm, Tm being the period of signal F/m obtained at the output of the dividers by m, 2 and 6. The two aforementioned measurements are synthesized by means of the computer, which deduces therefrom a phase displacement between $-Tm$ and $+Tm$ with a precision of $\pm 1$ ns for frequencies reaching approximately 1 GHz.

The precision of the measurement obtained by means of cascades C1 and C3 is realized by carrying out a frequency change of the input signals by means of frequency changing circuits, which receive the signal $F+\Delta F$ from a local oscillator OL (common to all the cascades of the same type). Following this frequency change, the sinusoidal signals $\Delta F(\phi 1)$, $\Delta F(\phi 2)$ obtained are phase-displaced by the same quantity as the signals $F(\phi 1)$ and $F(\phi 2)$ from which they come. It is then merely necessary to digitize these signals to make it possible to carry out the measurement of the phase displacement by chronometry using a counting circuit 10. The resolution obtained on the phase displacement measured between cascades C2 and C4 is written:

$$R=(\Delta F/F) \cdot T$$

The choice of an intermediate frequency $\Delta F$, which is as low as possible within the satisfactory operating limits, makes it possible to obtain a low resolution.

The effective measuring range obtained by means of cascades C1 and C3 is realized by digitizing basic signals. The division by m of these signals makes it possible to adapt the outputs N1 and N3 to the inputs of multiplexer 9. In order to facilitate understanding, m has been chosen in such a way that the output signals N1 and N3 have the same period as the output signals N2 and N4.

Thus, $F/m(\phi 1)=\Delta F(\phi 1)$ and $F/m(\phi 2)=\Delta F(\phi 2)$. However, this is not necessarily required and it is merely necessary for the phase displacement of the initial signals to be retained at the output of the circuits.

For $k>2$, the number of measuring cascade pairs increased in the same way. The outputs of these cascades are connected to inputs of multiplexer 9, which multiplexes all the input signals and makes it possible to supply each pair of signals relating to two cascades of the same type. Thus, successive comparisons are carried out in order to obtain information on the phase displacements between the different oscillators, in accordance with the aforementioned measuring process.

Figure 2:
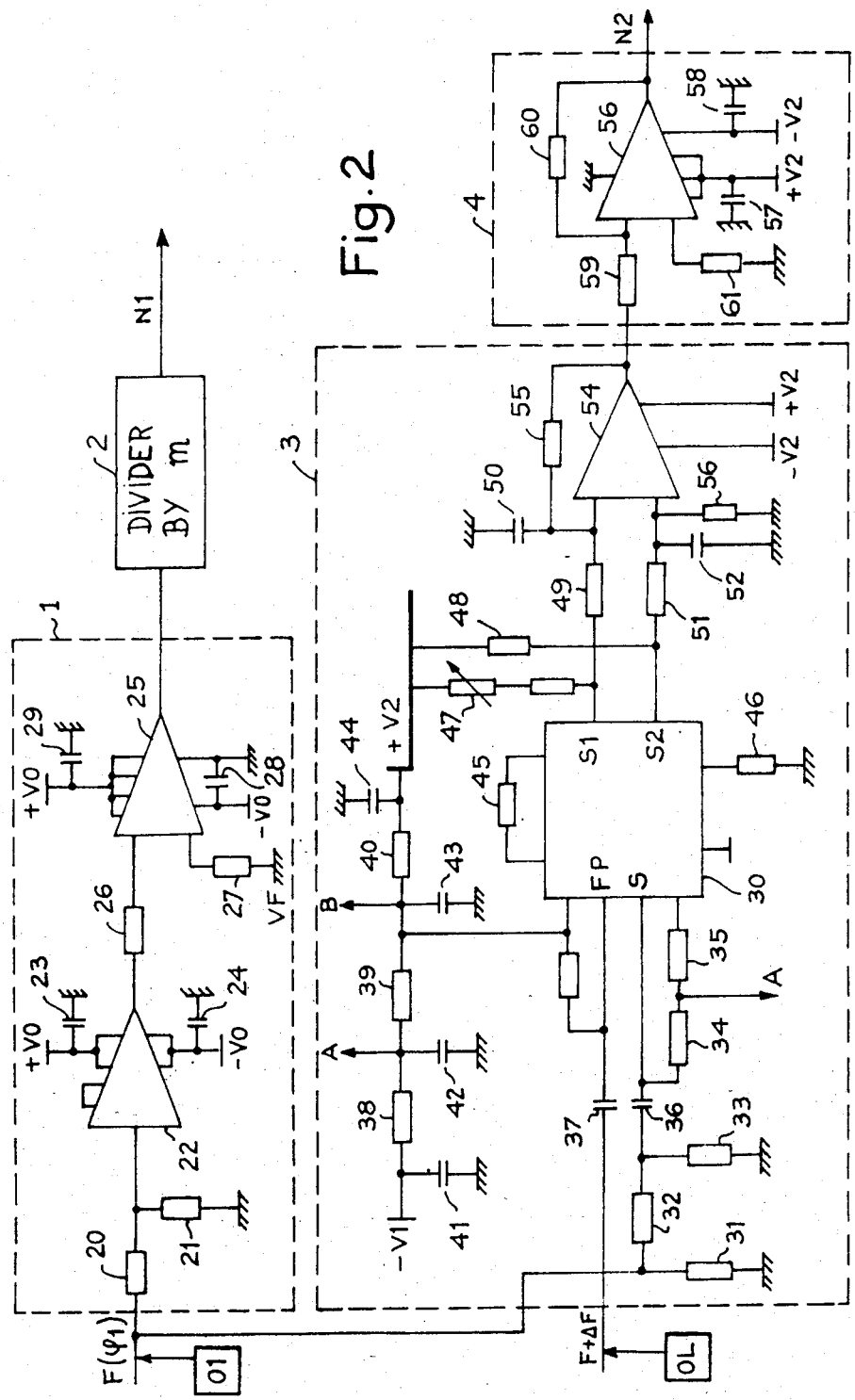
FIG. 2 a special construction of a pair of measuring cascades according to FIG. 1, FIG. 3 a special construction of the logic part of the phase comparator according to FIG. 1.

FIG. 2 shows a special construction of a pair of measuring cascades. The references used in cascades C1 and C2 have been retained.

The analog-digital converter 1 supplied by signal $F(\phi 1)$ comprises an attenuator attenuating the signal in a ratio of 1/10 using a resistance bridge 20, 21. The thus attenuated signal is applied to the input of a broad band follower amplifier 22. This amplifier has a gain close to 1 and makes it possible to separate the input signal from the downstream-connected circuits. Amplifier 22 is supplied by voltages $+V$ and $-VO$, said supply voltages being balanced to earth respectively by two capacitors 23 and 24.

The signal obtained at the output of amplifier 22 is applied to the non-inverting input of a fast comparator 25 across a resistor 26. A resistor 27 connected to the inverting input of comparator 25 makes it possible to fix the reference voltage VF and balances the input currents of comparator 25. Comparator 25 is supplied by voltages $+VO$ and $-VO$, respectively balanced by capacitors 28 and 29. The output signal of comparator 25 is a square-wave signal of cyclic ratio ½ in accordance with TTL logics and can be exploited by digital divider 2.

The frequency changing circuit 3 receiving signal $F(\phi 1)$ and signal $F+\Delta F$. An analog multiplier 30 receives at a signal input S, the signal $F(\phi 1)$ from oscillator O1, following attenuation in a $\pi$-filter and adaptation. The filter is constituted by resistors 31, 32, 33, whose values are determined as a function of the intrinsic characterics of multiplier 30. The input is adapted by means of resistors 34, 35. At a carrier frequency input FP, multiplier 30 receives the signal from local oscillator OL. Two capacitors 36 and 37 make it possible to balance inputs S and FP.

A polarization circuit makes it possible to polarize multiplier 30 and fix the current value as a function of the characteristics of multiplier 30. The polarization circuit comprises a group of three resistors 38–40, connected between supply voltages $-V1$ and $+V2$ which make it possible to obtain the desired polarisation voltages. The two polarization points A and B are alternatively earthed by capacitors 41–44. A resistor 45 makes it possible to regulate the peak amplitude of the signal at input S. A resistor 46 makes it possible to regulate the direct supply current of circuit 30. Two resistors 47 and 48 are connected to power supply $+V2$ and respectively to the outputs S1 and S2 of multiplier 30 in order to adapt the output stage.

The signals obtained at the outputs S1 and S2 of multiplier 30 contain sinusoidal components, whose frequencies are on the one hand the sum and on the other the difference of the frequencies of the input signals and also a few harmonics.

A filtering and amplification stage makes it possible to eliminate the sum frequencies and amplify the useful output signal. This stage comprises two low-pass RC-cells, respectively designated 49, 50 for output S1 and 51, 52 for output S2. The breakdown frequency of the RC-cells is determined so as to eliminate the harmonics and only retains the low frequency signal ΔF.

The stage also comprises an amplifier 54 supplied by voltages +V2, and −V2 and whose gain is fixed by means of resistors 55 and 56. The amplification of the signal makes it possible to increase the steepnesses of the rising fronts of signal ΔF.

The analog-digital converter 4 is constituted by a fast comparator 56 supplied by voltages +V2 and −V2. The supply voltages are balanced to earth by capacitors 57 and 58. Two resistors 59, 60 introduce a hysteresis effect into the switching and make it possible to obviate excitations around the switching threshold. A resistor 61, equal to resistor 59, connects the inverting input of amplifier 56 to earth and makes it possible to balance the inverting and non-inverting inputs of amplifier 56.

The output signal of the amplifier is a square-wave signal of cyclic ratio ½ in accordance with TTL logics. It contains the phase information of input signal F.

Figure 3:
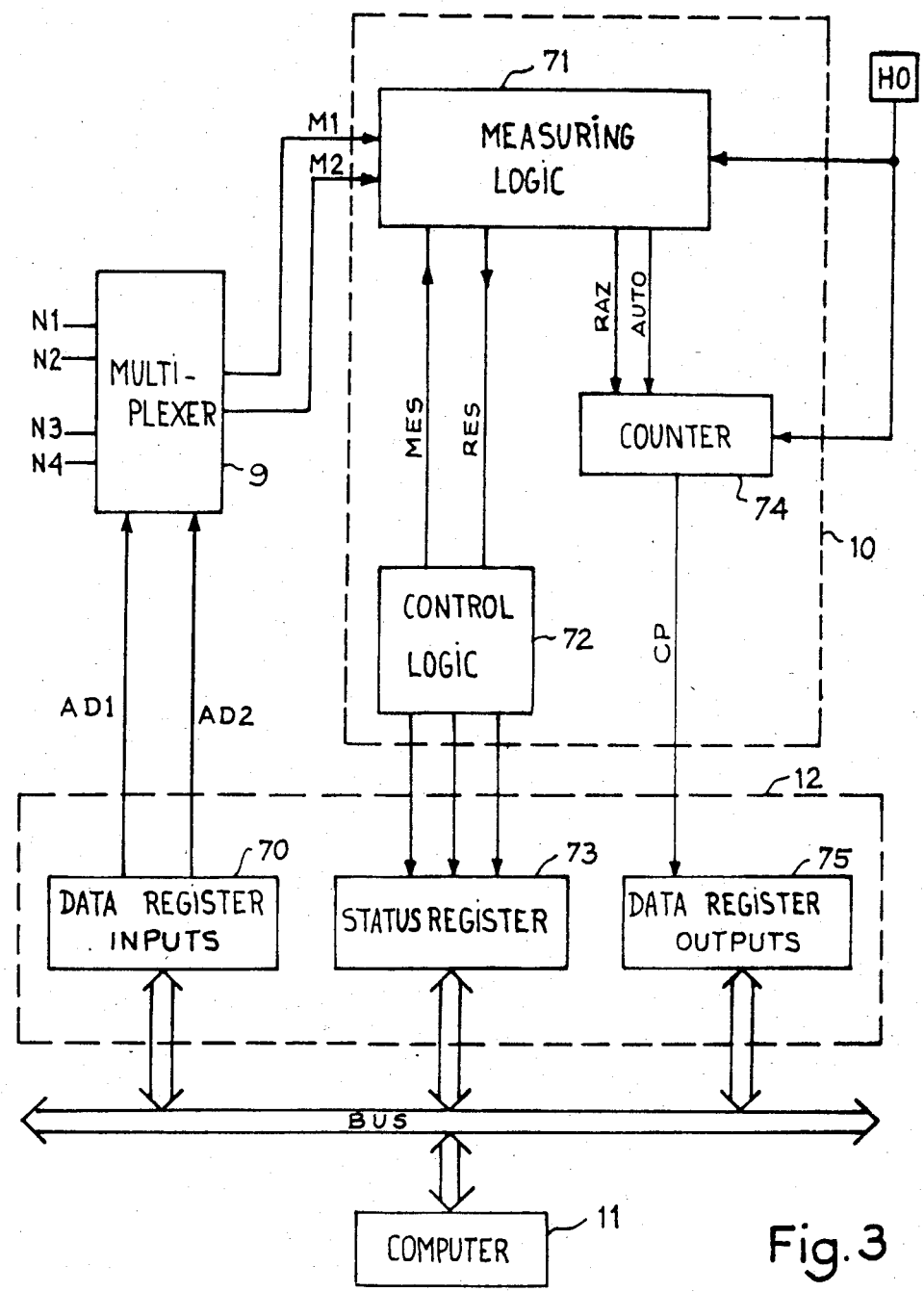

FIG. 3 shows a special construction of the logic part of the phase comparator. This part comprises multiplexer 9, counting circuit 10 and the computer coupler 12. The latter is connected to computer 11 by an address and data bus.

In the particular example where k is at the minimum equal to 2, there are two fine measuring cascades supplying signals N1 and N3 and two measuring cascades giving a wide range and supplying signals N2 and N4. Thus, the multiplexer then requires four inputs and two outputs.

An input data register 70 of coupler 12 supplies signals AD1 and AD2 transmitted by computer 11 which, as a function of their state, make it possible to respectively select signals N1, N3, in order to carry out the fine measurement of the phase displacement between the oscillators in question, or to select signals N2, N4 in order to carry out a measurement of the phase displacement in an extended range. At the outputs of multiplexer 9, there are either signals N1, N3, or signals N2, N4 on channels M1, M2. These channels are connected to counting circuit 10, which comprises a logic measurement circuit 71, which receives and transmits signals to a logic control circuit 72, connected to computer 11 by means of a status register 73. The MES signal transmitted by circuit 72 makes it possible to start the measurements. Circuit 71 transmits a signal AUTO to a counter 74, which then starts the counting of the time intervals separating a rising front of the signal of channel M1 (start signal) and a rising front of the signal channel M2 (stop signal).

Counting takes place on 16 bits, the counting clock being signal HO at 20 MHz. In this specific example, the counter makes it possible to measure the time intervals from 0 to 3.277 ms. Circuit 71 also controls the resetting of counter 74 by supplying a signal RAZ. The counting data CP are transmitted to an output data register 74 connected to computer 11 by the data bus.

The phase measurement in an extended range makes it possible to determine two limits between which the phase displacement Δϕ is located. Thus, Δϕ is between I−ΔI and I+TO+ΔI, I representing the time which has elapsed between the counting start signal and the counting stop signal. Thus, ΔI representing the propagation time in the logic circuits and TO the period of clock HO.

It is therefore possible to write a first relation:

$$I-\Delta I < \Delta\phi < I + TO + \Delta I \quad (1)$$

In our specific example TO=50 ns and T the period of the signals transmitted by the oscillators is 200 ns. TO is chosen so that TO+2 ΔI is less than T. The fine phase measurement makes it possible to establish the following relation; in which $\Delta\phi_{abs} = \Delta\phi + k.T$, in which $\Delta\phi_{abs}$ is the phase displacement in absolute values and k is to be determined.

It is therefore possible to write a second relation:

$$\Delta\phi_{abs} = \Delta\phi + k.T \quad (2)$$

Synthesis between relations (1) and (2) makes it possible to determine a single value for k. In the present special construction, the phase displacement Δϕ is between −1 ms and +1 ms with a precision of ±1 ns.

Figure 4:
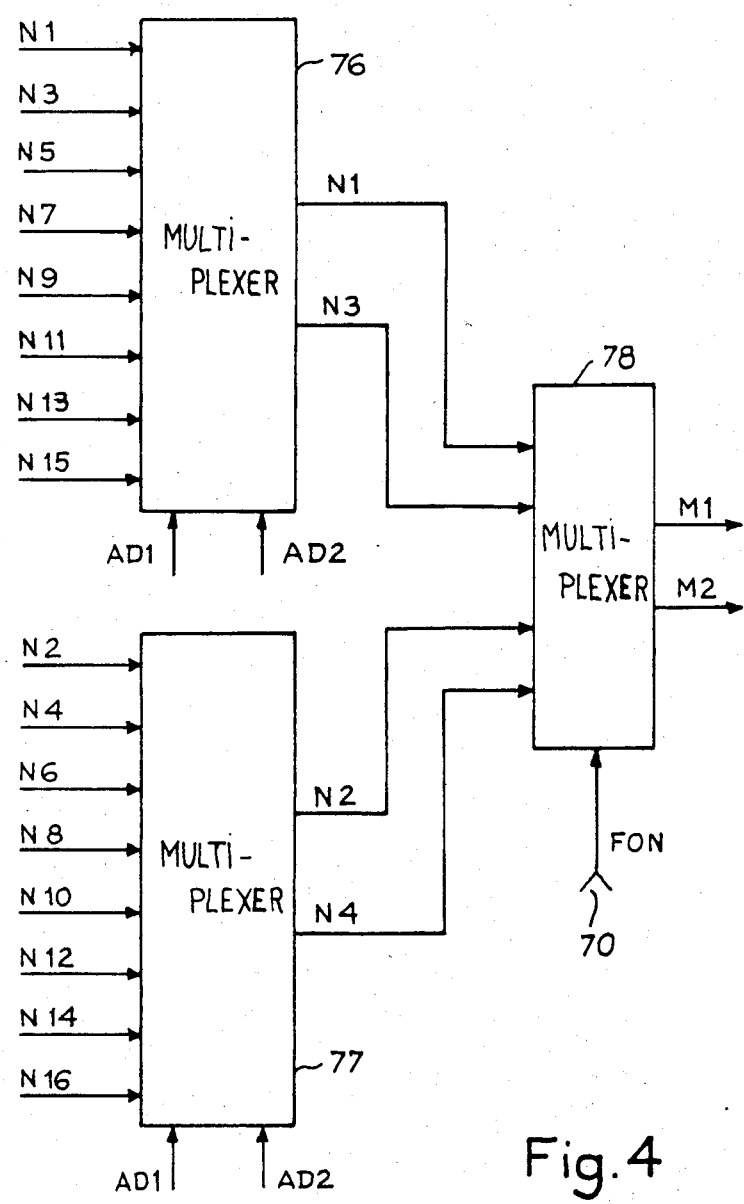
FIG. 4 a special construction of the multiplexer 9 according to FIG. 1.

FIG. 4 shows a partial diagram of the logic part relating to the construction of multiplexer 9, in the case where the number of oscillators exceeds 2 (k>2). For example, we will take the case of 8 oscillators, whose phase is to be compared in pairs.

Multiplexer 9 is constituted by three multiplexers. A multiplexer 76 with 8 inputs and 2 outputs receives the signals N1, N3, N5, N7, N9, N11, N13, N15 supplied by the cascades of the same nature, in which frequency division takes place. A multiplexer 77 with 8 inputs and two outputs receives the signals N2, N4, N6, N8, N10, N12, N14, N16 supplied by the cascades of the same nature in which frequency changing is carried out.

The selection control signals AD1 and AD2 make it possible to select two from among 8 signals for each multiplexer 76 and 77. For example, signals N1 and then N3 have been selected at the output of multiplexer 76. In this case, the signals N2 and then N4 are selected at the output of multiplexer 77.

A multiplexer 78 with four inputs and two outputs receives the signal selected at the outputs of multiplexers 76 and 77. This multiplexer is controlled by a signal FON, transmitted by register 70 shown in FIG. 3 and which, as a function of its state, selects N1 then N3 or N2 and then N4.

The performance of the other operations is identical to that described in the case where there were two oscillators.

Thus, the incompatibility of obtaining an extensive measuring means and a precision compatible with very high stability oscillators is removed by subdividing the measurement in the three stages.

The first stage consists of carrying out a precise phase measurement by carrying out a frequency change for each basic signal to be compared and by digitizing the signals. One of the signals obtained makes it possible to control the start of counting, whilst the other controls the end of counting. The time interval obtained gives a modulo T phase displacement measurement, T being the period of the basic signal.

The second stage consists of carrying out a less precise phase measurement, but with a wide range, by carrying out a digitization and then a digital division of each basic signal. One of the signals obtained makes it possible to control the start of counting and the other control the end of counting. The time interval obtained gives the range in which the phase displacement is located.

The third stage consists of synthesizing the two functions to obtain the absolute phase displacement value with the anticipated precision.

Figure 5:
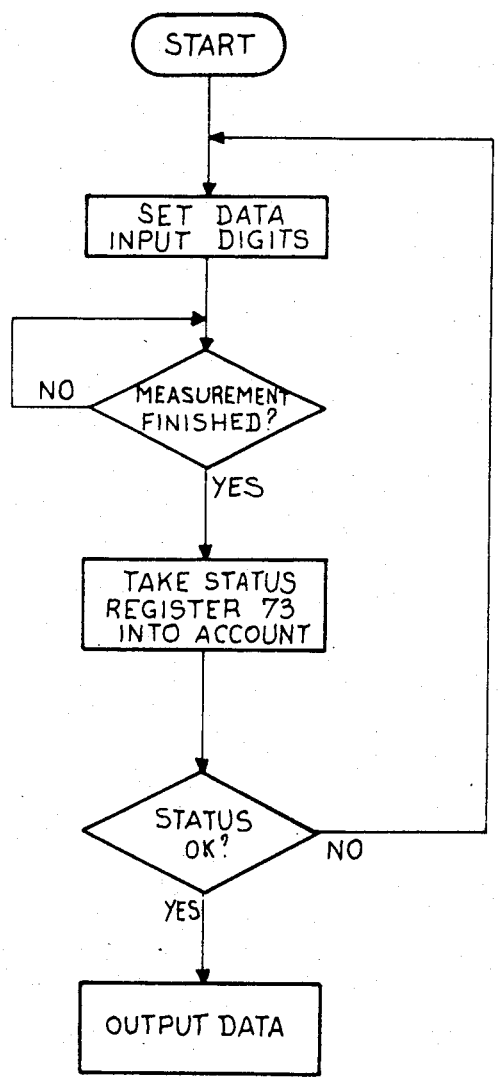
FIG. 5 shows a flow diagram according to the present invention.

FIG. 5 is a flow diagram showing the basic controlling steps of the computer. As has been described in regard to FIG. 3, the computer first sets the data input digits in order to select the proper inputs to the multiplexer. Once the measurement has been finished the computer checks the status of register 73. If the status is proper, the data in the output register 75 is then received by the computer.

What is claimed is:

1. A phase comparator for comparing the phase of a plurality of signals at the same frequency supplied by respective oscillators comprising a system of pairs of measuring cascades, in which each pair has a first and a second measuring cascade connected in parallel to an oscillator and supplied by the signal transmitted by said oscillator, said first cascade having an analog-digital converter followed by a digital divider, in order to supply a first signal, said second cascade having a frequency changing circuit, followed by an analog-digital converter, for supplying a second signal; a multiplexer receiving the signal supplied by each cascade and supplying in pairs the signals relating to the two cascades of the same type; a counting circuit synchronized by a counting clock receiving in pairs the signals supplied by the multiplexer, one of these signals representing a count start signal and the other representing a count stop signal, in order to count the time separating the arrival of the start signal and the arrival of the stop signal and transmit a counting signal; a computer giving selection orders of the output signals of the multiplexer, supplying control signals for the counting circuit and receiving the counting signal; and a circuit for coupling the computer, the counting circuit and the multiplexer.

2. A phase comparator according to claim 1, wherein the counting circuit comprises a counter synchronized by the counting clock in order to count the time interval separating a start signal of a stop counting signal and for supplying a counting signal, a logic measuring circuit receiving the output signals from the multiplexer and receiving a measuring order enabling it to start the count by transmitting a counting signal to the counter and supplying an available measurement signal and for resetting the counter at the end of the measurement, and a logic control signal supplying the measuring order to the logic measuring circuit and receiving the available measuring signal.

3. A phase comparator according to claims 1 or 2, wherein the coupling circuit connected to the computer comprises an input data register transmitting selection signals from the computer to the multiplexer, a status register receiving the states of the logic measuring circuit by means of the logic control circuit and transmitting these states to the computer, and an output data register transmitting the counting signal from the counter to the computer.

4. A phase comparator according to the claim 1, wherein the computer is connected to the coupling circuit by means of an address and data bus.

5. A phase comparator according to the claim 1, wherein the analog-digital converter of the first cascade comprises an attenuator constituted by a resistance bridge, attenuating the input signal, followed by a broad band follower amplifier, followed by a comparator comparing the output signal from the amplifier with a reference voltage and supplying a square-wave signal of cyclic ratio $\frac{1}{2}$, which can be exploited by the digital divider.

6. A phase comparator according to the claim 1, wherein the frequency changing circuit of the second cascade comprises a matching filter constituted by a group of resistors receiving the input signal and supplying a matched signal, an analog multiplexer receiving the matched signal and a first input and receiving at a second input a signal of a frequency differing from that of the signal received at the first input, coming from a local oscillator and able to supply, after filtering, a low frequency carrier signal of the phase of the signal received at the first input and resulting from the difference between the signals received at the first and second inputs, a polarization circuit making it possible to obtain the polarization voltages of the multiplexer and an amplifier receiving the low frequency signal and which amplifies this signal.

7. A phase comparator according to the claim 1, wherein the analog-digital converter of the second cascade is constituted by a fast hysteresis comparator supplying a square-wave signal of cyclic ratio $\frac{1}{2}$, which can be exploited by the multiplexer.

8. A phase comparator according to the claim 1, wherein the multiplexer is constituted by a single multiplexer with four inputs and two outputs, able to receive the first and second signals from a first cascade and the first and second signals from a second cascade, and able to supply the first signals or the second signals, as a function of the selection control signals.

9. A phase comparator according to the claim 1, wherein the multiplexer comprises a first, a second and a third multiplexer, the first multiplexer receiving the first signal from the eight first cascades and, as a function of the selection control signals, supplying two of these signals, the second multiplexer receiving the second signals from eight second cascades and supplying them as a function of the selection control signals, two of these signals and the third receiving the output signals from the first and second multiplexers and supplying under the control of the selection signal from the input data register, one of the two signals from each multiplexer.

* * * * *